US 6,575,739 B1

(12) United States Patent
Yoo

(10) Patent No.: US 6,575,739 B1
(45) Date of Patent: Jun. 10, 2003

(54) CONFIGURABLE WAFER FURNACE

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 10/123,723

(22) Filed: Apr. 15, 2002

(51) Int. Cl.[7] ................................................. F27D 3/00
(52) U.S. Cl. ....................... 432/239; 432/206; 432/245; 219/309; 219/411
(58) Field of Search .......................... 432/4, 5, 10, 206, 432/239, 241, 243, 245, 253, 258; 219/309, 405, 411

(56) References Cited

U.S. PATENT DOCUMENTS

| | | | | |
|---|---|---|---|---|
| 4,976,613 A | * | 12/1990 | Watanabe | 432/241 |
| 5,716,207 A | * | 2/1998 | Mishina et al. | 432/253 |
| 5,837,555 A | * | 11/1998 | Kaltenbrunner et al. | 438/796 |
| 6,139,641 A | * | 10/2000 | Inokuchi et al. | 118/724 |
| 6,168,427 B1 | * | 1/2001 | Cho et al. | 432/241 |
| 6,303,906 B1 | * | 10/2001 | Yoo | 219/390 |

* cited by examiner

Primary Examiner—Gregory Wilson
(74) Attorney, Agent, or Firm—MacPherson Kwok Chen & Heid LLP

(57) ABSTRACT

A processing system including a chamber defining an interior cavity having a processing tube assembly arranged within the interior cavity. A heating assembly moveable relative to the processing tube assembly from a first position where said processing tube assembly is disposed within the heating assembly and a second position where the processing tube assembly is exposed to an internal environment within the interior cavity of the chamber.

13 Claims, 5 Drawing Sheets

CONFIGURABLE WAFER FURNACE

BACKGROUND

1. Field of Invention

This invention generally relates to semiconductor manufacturing equipment and, more particularly, to an apparatus and method for rapid thermal processing of a semiconductor wafer.

2. Related Art

New processing and manufacturing techniques are continuously being developed to make further advancements in the development of semiconductor devices, especially semiconductor devices of decreased dimensions. One such processing technique is know as Rapid Thermal Processing (RTP), which reduces the amount of time that a semiconductor device is exposed to high temperatures during processing. The RTP technique, typically includes irradiating the semiconductor device or wafer with sufficient power to quickly raise the temperature of the wafer and hold it at that temperature for a time long enough to successfully perform a fabrication process, but which avoids such problems as unwanted dopant diffusion that would otherwise occur at the high processing temperatures.

In a typical RTP chamber, even after the power is removed from heat source, the chamber must be allowed to cool before a semiconductor device can be removed from the chamber. The semiconductor device can remain exposed to temperatures for a longer period of time then desired for a given process. In addition, since cooling times can be relatively substantial, the process can be slowed to a point where the rate of production of semiconductors becomes uneconomical.

SUMMARY

The present invention provides a heating apparatus and method for isothermally distributing a temperature across the surface of a semiconductor device or wafer during processing. The present invention also provides for the cooling of the chamber at a rate, which improves the throughput of the heating apparatus.

In the present invention, a chamber is provided defining a cavity. Included within the cavity is a processing tube, which is configured to receive a single or multiple semiconductor wafers. As described in greater detail below, a plurality of resistive heating elements are provided and advantageously arranged in the cavity proximate to the processing tube. Preferably, the heating elements are disposed across the chamber and are aligned in close proximity to one another so as to provide an even heating temperature distribution. Advantageously, the resistive heating elements may be positioned to substantially surround the processing tube to provide dual-sided heating of the wafer. Beneficially, the chamber including the heating elements is separable from the processing tube. Advantageously, by separating the heating elements from the processing tube, heat dissipation from the processing tube is accelerated.

In one aspect of the invention, a processing system is provided. The processing system includes a chamber defining an interior cavity. Arranged within the interior cavity are a processing tube assembly and a heating assembly. The heating assembly is moveable relative to the processing tube assembly from a first position where the processing tube assembly is disposed within the heating assembly and a second position where the processing tube assembly is exposed to an internal environment within the interior cavity of the chamber.

In another aspect of the present invention, a processing apparatus is provided. The apparatus includes a processing tube and a heating chamber including a plurality of heating elements. The heating chamber defines an internal space for removably receiving the process tube. The apparatus also includes an actuation mechanism to move the process tube into and out from the internal space.

In yet another aspect of the present invention, a method is provided for conducting a process. The method includes providing a processing system having a process tube disposed in an internal space defined by the processing system; and separating the process tube from the internal space.

In yet another embodiment, an apparatus is provided for conducting a process. The apparatus includes a processing module; a transport module including a transport mechanism coupled to the processing module; and a gate assembly including portions of walls of the transport module which can be moved from a closed position where the transport module is isolated from an external environment to an open position where the transport module is exposed to the external environment. The gate assembly when in the open position provides clearance for the transport mechanism to rise in and out from within the transport module.

Advantageously, the inner temperature of the processing tube can be reduced without substantially reducing the inner temperature of the heating chamber. More specifically, the present invention allows the wafer to be cooled without the need to reduce or shut-off power to the heating elements. Beneficially, the present invention reduces the cycle time required for ramping up a process chamber to a process temperature, cooling wafers to an acceptable handling temperature, and re-heating the process chamber to conduct additional processes.

These and other features and advantages of the present invention will be more readily apparent from the detailed description of the preferred embodiments set forth below taken in conjunction with the accompanying drawings.

DETAILED DESCRIPTION

Figure 1:
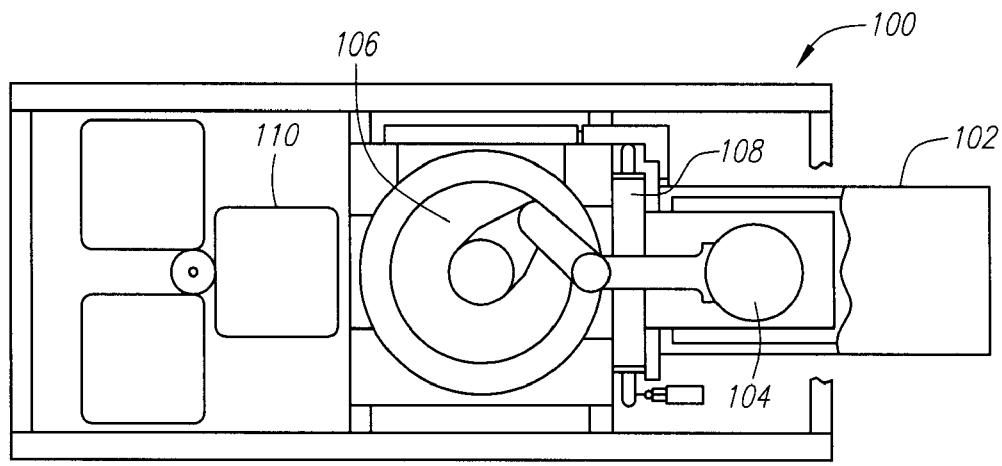
FIG. 1 is a simplified top view of a semiconductor wafer processing system in accordance with an embodiment of the present invention.

FIG. 1 is a top view of a semiconductor wafer processing system 100 that establishes a representative environment of the present invention. Processing system 100 includes a reactor or thermal processing chamber 102, which may be at atmospheric pressure or under vacuum pressure. Processing chamber 102 can accept a semiconductor wafer 104 from a robot 106 through a gate valve 108. Wafers 104 are loaded from loading station 110. A representative processing system is fully disclosed in U.S. patent application Ser. No. 09/451, 677, filed Nov. 30, 1999, which is herein incorporated by reference for all purposes.

In accordance with the present invention, processing chamber 102 can be an RTP reactor, such as those used in thermal anneals. In other embodiments, processing chamber 102 can be other types of reactors, such as those used for dopant diffusion, thermal oxidation, nitridation, chemical vapor deposition, and similar processes.

Figure 2A:
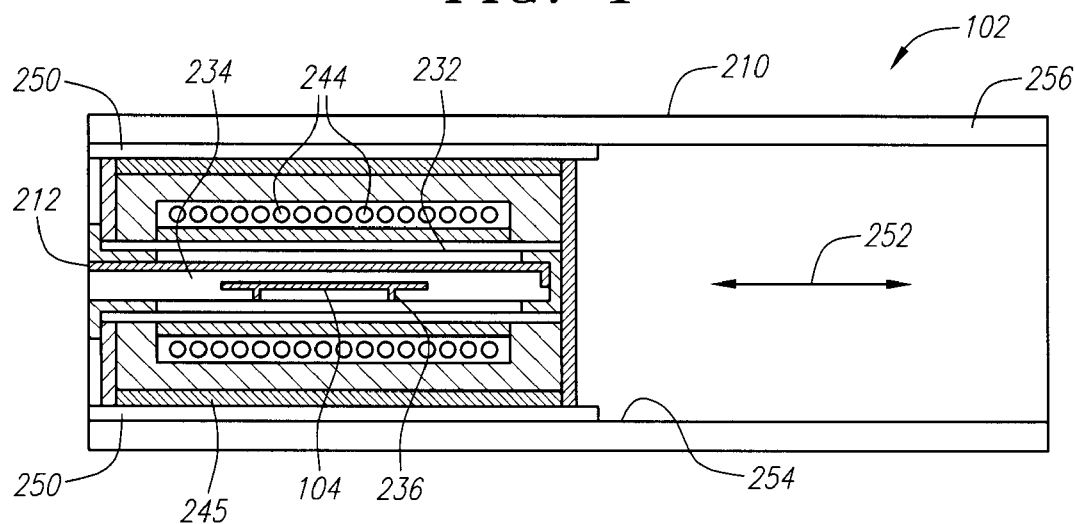
FIGS. 2A and 2B, are simplified cross-sectional views of a processing system in accordance with one embodiment of the present invention.
Figure 2B:
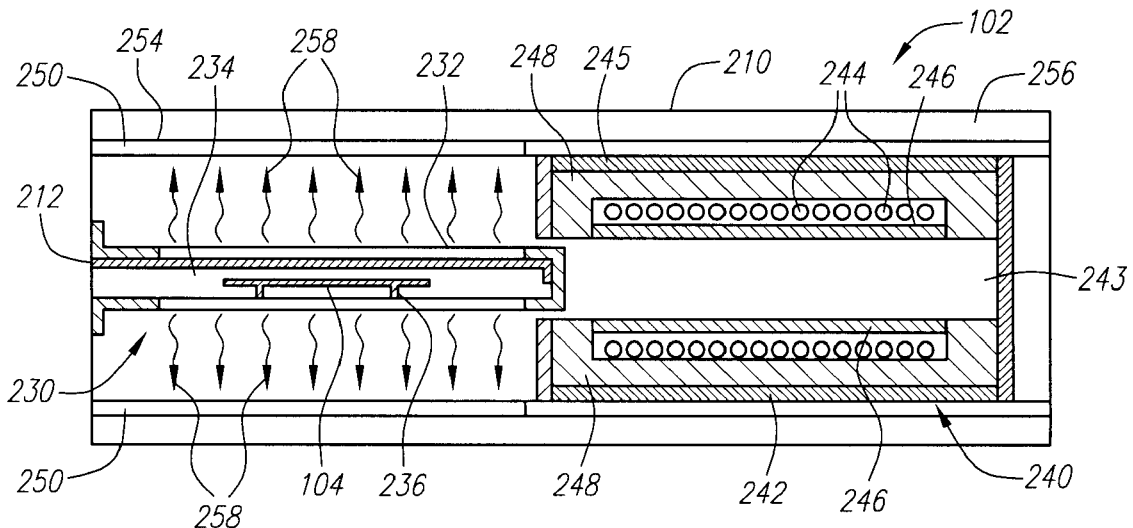

Referring now to FIGS. 2A and 2B, a simplified cross-sectional view of processing chamber 102 is shown in accordance with one embodiment of the present invention. Externally, processing chamber 102 may be a metallic shell 210 preferably made of aluminum or similar metal, defining an opening 212 configured to receive a wafer for processing.

As understood with reference to FIG. 2B, in one embodiment, processing chamber 102 may generally include two assemblies: A process tube assembly 230 and a heating assembly 240.

Process tube assembly 230 can include a process tube 232, which defines an interior cavity 234 in which processing of wafer 104 can occur. In one embodiment, process tube 232 may be constructed with a substantially rectangular cross-section, having a minimal internal volume surrounding wafer 104. In one embodiment, the volume of process tube 232 is usually no greater than 5000 cm$^3$, preferably the volume is less than about 3000 cm$^3$. One result of the small volume is that uniformity in temperature is more easily maintained. Process tube 232 can be made of quartz, but may be made of silicon carbide, Al$_2$O$_3$, or other suitable material.

To conduct a process, process tube 232 can be capable of being pressurized. Typically, tube 232 should be able to withstand internal pressures of about 0.001 Torr to 1000 Torr, preferably between about 0.1 Torr and about 760 Torr.

Figure 4:
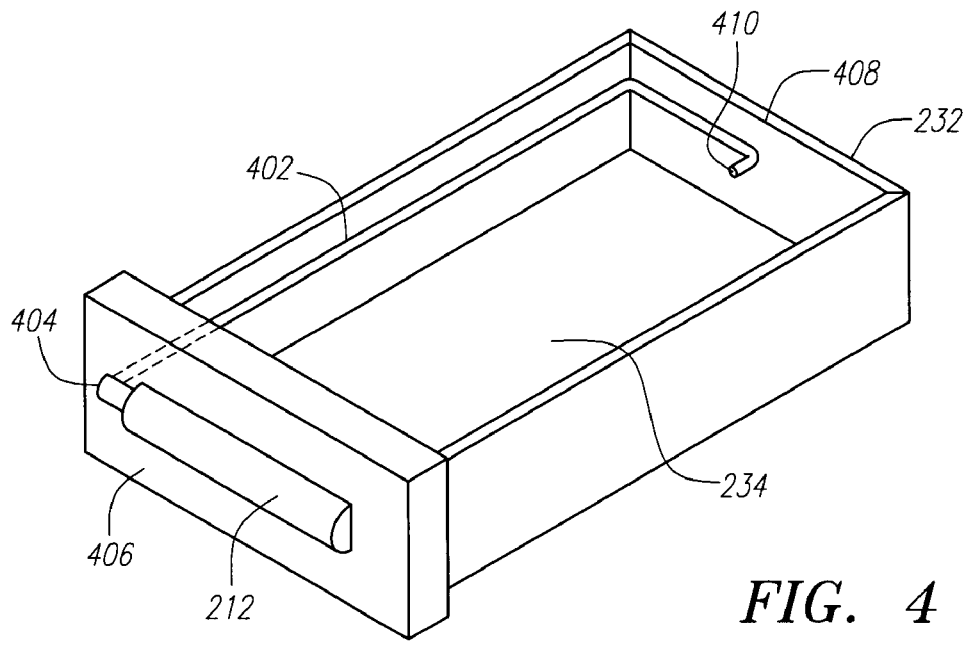
FIG. 4 is a simplified perspective view of a process tube in accordance with an embodiment of the present invention.

As illustrated in FIG. 4 process tube 232 can include a gas tube 402. In one embodiment, gas tube 402 includes an inlet 404 positioned at the front end 406 of process tube 232 proximate to opening 212 and an outlet 410 positioned on a back end 408. In this embodiment, gas tube 402 is formed into the walls of process tube 232 to create a pathway for process gases entering the process tube at front end 406, to be directed to the back end 408 and dispensed from tube outlet 410 into cavity 234. Alternatively, gas tube 402 can be formed along the walls of process tube 232.

Positioned within cavity 234 of process tube 232 are wafer support standoffs 236, which support the single wafer 104. Standoffs 236 may be any high temperature resistant material, such as quartz. In some embodiments, standoffs 236 may have a height of between about 50 μm and about 20 mm.

Opening or aperture 212 provides access for the loading and unloading of wafer 104 before and after processing. Aperture 212 may be a relatively small opening, but with a height and width large enough to accommodate a wafer of between about 0.5 to 2 mm thick and up to about 300 mm (~12 in.) in diameter, and a portion of robot 106 (FIG. 1) passing therethrough. The height of aperture 212 can be between about 18 mm and 50 mm, and preferably, no greater than about 20 mm.

Referring again to FIGS. 2A and 2B heating assembly 240 includes a heating chamber 242 defining an open internal space 243 substantially surrounded by heating elements 244. Internal space 243 is sized and shaped so as to receive process tube 232.

Optionally, heating assembly 240 can include heat diffusing members 246. Heat diffusing members 246 can be positioned proximate to and typically overlaying heating elements 244 so as to be between heating elements 244 and process tube 232 when the process tube is positioned in internal space 243. Heat diffusing members 246 absorb the thermal energy output from heating elements 244 and dissipate the heat evenly throughout open space 243. Heat diffusing members 246 may be any suitable heat diffusing material that has a sufficiently high thermal conductivity, preferably silicon carbide, Al$_2$O$_3$, or graphite.

In some embodiments, heating assembly 240 can include thermal insulation layers 248, which help to maintain temperature levels within heating chamber 242 during and after processing. Thermal insulation layers 248 are generally positioned between the heating elements 244 and outer wall 245 of heating chamber 242. Thermal insulation layers 248 may be made of any suitable insulation, such as a ceramic fiber material.

In accordance with the present invention, process tube assembly 230 and heating assembly 240 can be removably mated together in a male/female arrangement, such that substantially all of process tube assembly 230 is captured into internal space 243.

In one exemplary arrangement, process tube assembly 230 is mounted internally to a first end of process chamber 102 using conventional mounting techniques. The open end of process tube 232 is aligned with opening 212 to provide access to cavity 234 of process tube 232. Once mounted, process tube assembly 230 is held in a cantilevered arrangement within process chamber 102.

Heating assembly 240 is also disposed within process chamber 102 and can be made to move from one end of process chamber 102 to the other end relative to process tube assembly 230. As shown in FIGS. 2A and 2B, heating chamber 242 is coupled to a drive assembly 250 also mounted within process chamber 102. Drive assembly 250 provides a mechanism which permits heating assembly 240 to translate within process chamber 102 in the direction indicated by arrow 252 (FIG. 2A). Drive assembly 250 can be any conventional mechanism that provides linear motion and that can be driven manually or automatically.

Figure 5:
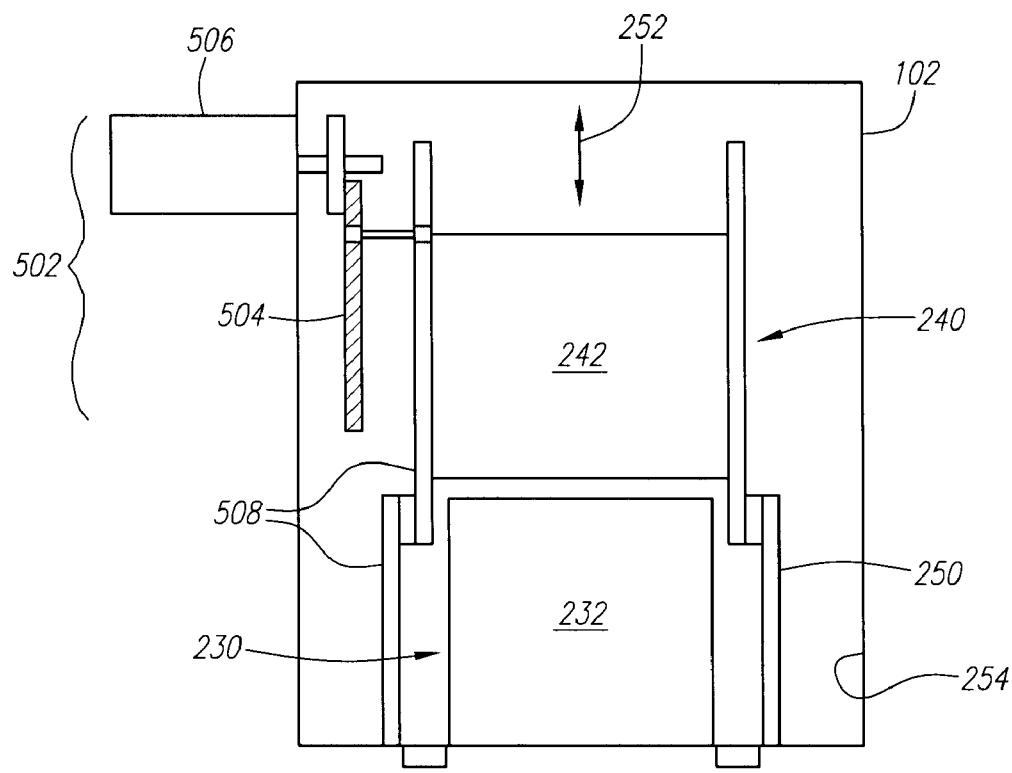
FIG. 5 is a simplified top view of the processing system of FIGS. 2A and 2B including a linear motion mechanism in accordance with an embodiment of the present invention.

As shown in FIG. 5, in one embodiment, drive assembly 250 incorporates a driving mechanism 502 to operate drive assembly 250. Drive mechanism 502 can include any system designed to transfer rotational motion to linear motion, such as a gear, belt, or pulley drive. Alternatively, drive mechanism 502 can include a hydraulic or pneumatic drive system. In the example shown in FIG. 5, with no intent to limit the invention, driving mechanism 502 includes a screw or worm drive 504 coupled in a conventional manner to a motor 506 and a linear motion mechanism 508, such as a linear actuator or linear guide. Examples of typical linear actuators and linear guides for use with the present invention are available from THK Ltd. of Tokyo, Japan.

In operation, heating chamber 242 is coupled to linear motion mechanism 508, which is operably coupled to drive mechanism 502. Motor 506 operates to cause worm drive 504 to rotate either clockwise or counter-clockwise, as desired. The coupling of worm drive 504 to linear motion mechanism 508 causes heating assembly 240 to move in the directions indicated by arrow 252.

Accordingly, as heating assembly 240 slides toward a front end of process chamber 102, the cantilevered process tube assembly 230 is received into internal space 243. In this position, heating elements 244, heat diffusing members 246, if present, substantially surround process tube 232, thus, forming an operational processing unit.

Once processing is complete or when cooling is desired, the movement of heating assembly 240 can be reversed. Heating assembly 240 moves away from process tube assembly 230 to a back end of process chamber 102. Process tube 232 becomes exposed to the inner walls 254 and inner environment of process chamber 102.

Moving heat assembly 240 from a configuration where the heat assembly substantially surrounds process tube assembly 230 (FIG. 2A) to a configuration where process tube 232 is exposed to the inner walls 254 and inner environment of process chamber 102 (FIG. 2B), allows heat to be transferred away from process tube 232 as represented by arrows 258 to the inner atmosphere and inner walls 254 of process chamber 102. The inner temperature of process tube 232 can be rapidly reduced, allowing wafer 104 to cool more rapidly.

In addition, separating process tube assembly 230 from heating assembly 240 allows cooling of process tube 232 without substantially cooling down heating chamber 242. Thus, when process tube assembly 230 and heating assembly 240 are brought back together, the ramp-up time for re-heating process tube 232 is also reduced.

In some embodiment, various well known devices and methods for facilitating the transfer of heat can be applied to chamber 102 to increase the temperature difference between the walls 254 and process tube 232 and thus, accelerate the heat transfer process. For example, a cooling jacket 256 can be placed around process chamber 102 to lower the temperature of inner walls 254, thus allowing inner walls 254 to more quickly absorb heat.

Figure 3A:
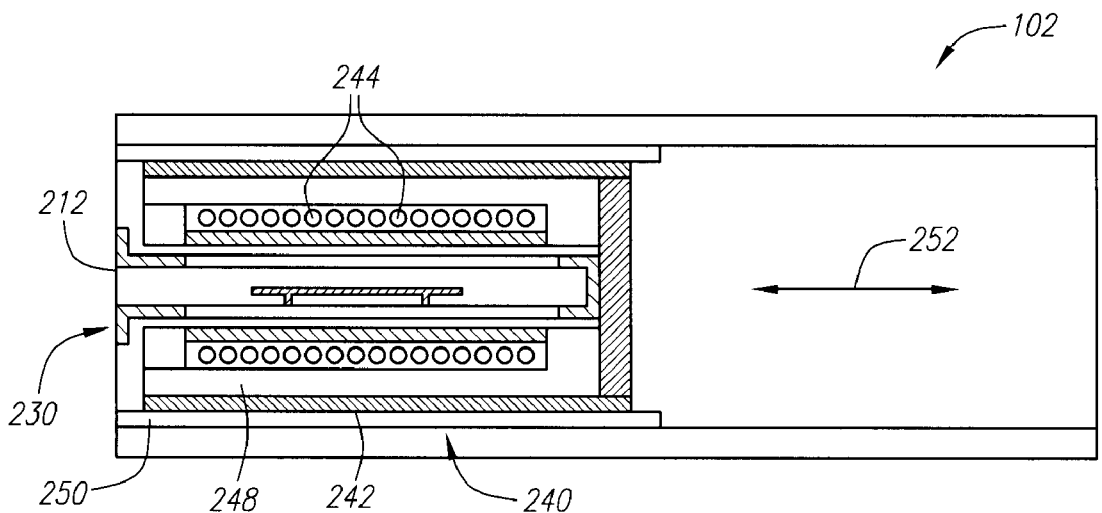
FIGS. 3A and 3B are a simplified cross-sectional view of a processing system in accordance with one embodiment of the present invention.
Figure 3B:
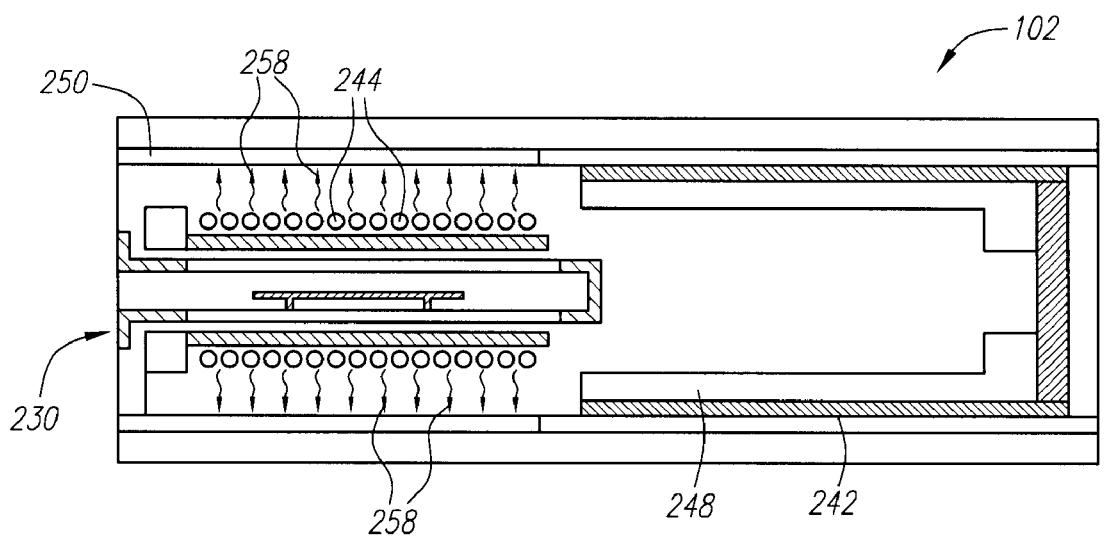

FIGS. 3A and 3B are a simplified illustration of an alternative embodiment of the present invention. In this alternative embodiment, the primary function of processing system 100 remains the same. However, in this embodiment, after processing or when cooling is desired, only a portion of heating assembly 240 is moved away from process tube assembly 230 in the direction indicated by arrows 252.

As shown in FIG. 3B, the outer shell of heating chamber 242, as well as insulation 248, if provided, are removed from a position surrounding heating elements 244 and process tube assembly 230. In this embodiment, process tube 232 and heating elements 244 are exposed to inner walls 254 and the inner environment of process chamber 102. Heat is transferred away from process tube 232 and heating elements 244 to the walls 254 as indicated by arrows 258, allowing the inner temperature of process tube 232 to be more rapidly reduced.

In the present invention, effort has been made to include a processing system which includes a process module and wafer transport module of minimal proportions. Keeping the volume of the transport chamber and process chamber small, minimizes the amount of impurities introduced into these chambers during processing. For example, the process module and transport module are kept small in volume to reduce the amount of impure $O_2$ or other unwanted gases from being introduced into the processing environment.

A typical processing system may include a process module coupled to a transport module that may have a capacity of about 400 liters. Typically, to remove residual or impure $O_2$, the 400 liter module can be pumped down. For a module of this volume, a pump down procedure can take approximately 15 minutes. Since the pump down procedure takes place between the processing of each wafer, 15 minutes represents a large block of time in wafer processing. Another method for reducing residual or impure $O_2$, is to purge the module with $N_2$. However, a purge method typically requires an abundance of $N_2$, which is ultimately wasted.

Figure 6A:
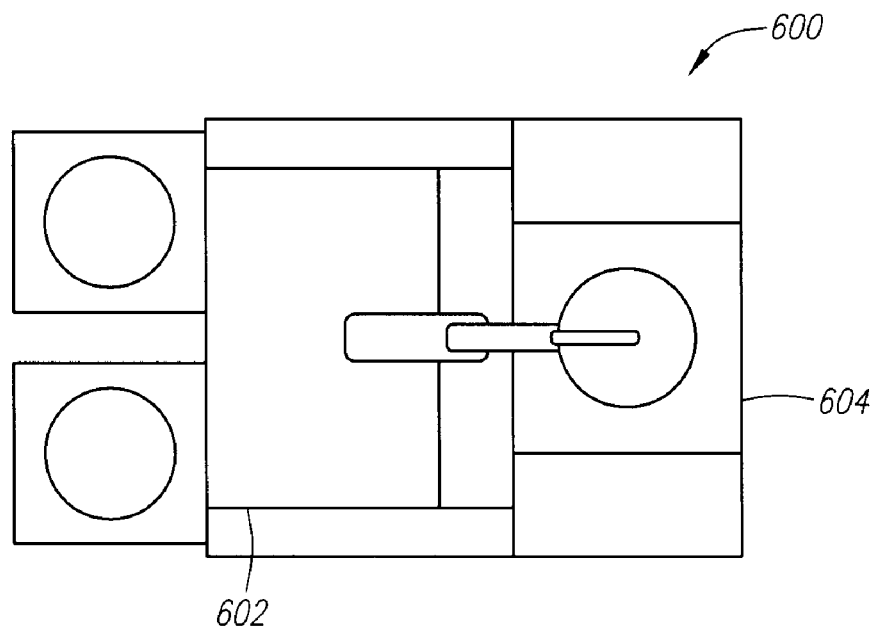
FIGS. 6A and 6B are simplified illustrations of a processing system including a reduced profile and volume in accordance with an embodiment of the present invention.
Figure 6B:
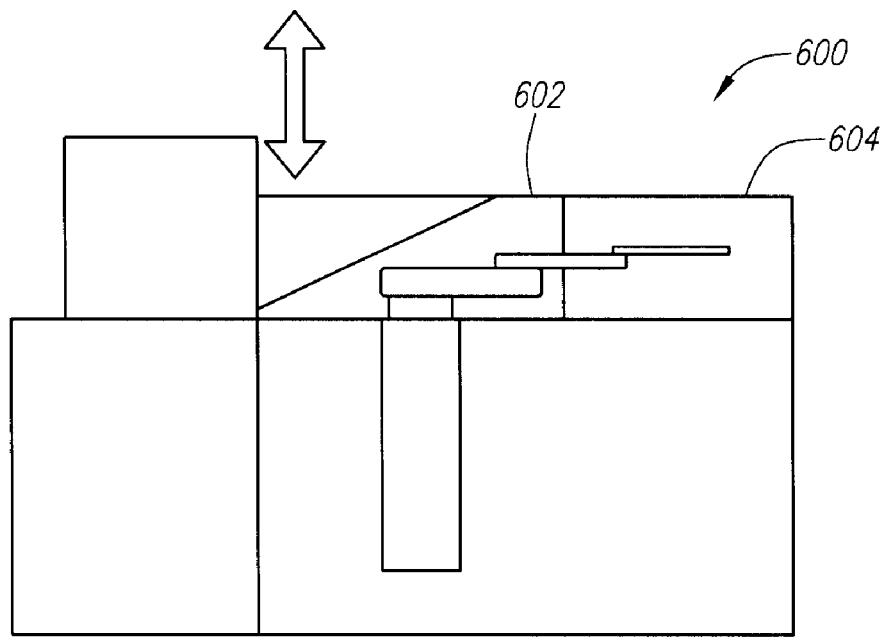

FIGS. 6A and 6B are top and side views, respectively, of a simplified illustration of a processing system 600 including a transport module 602 coupled to a process module 604. In accordance with the present invention, the volume of transport module 602 can be reduced, such that the total resulting volume of the combined transport module 602 and the process module 604 is approximately between 40 and 50 liters.

Because of the reduced dimension of transport module 602, typical robots well known in the industry for transporting wafers would be incapable of performing satisfactorily. Height limitations within the transport module would not provide enough clearance for the robots operations.

Figure 7:
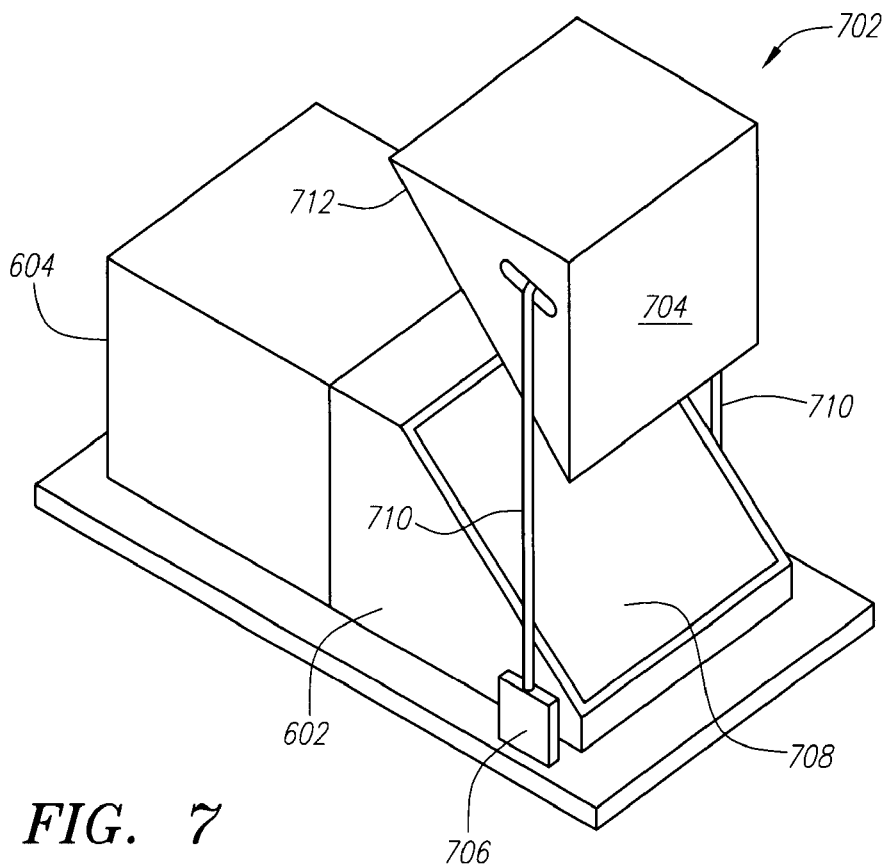
FIG. 7 is a simplified perspective view of a portion of the processing system of FIGS. 6A and 6B.

In accordance with the present invention, a gate valve assembly 702 can be formed with, or mounted on, transport module 602 to provide a closeable/sealable access that allows a typical robot to operate with transport module 602. FIG. 7 is a simplified illustration of an embodiment of gate valve assembly 702. In this embodiment, gate valve assembly 702 includes a gate 704 coupled to a pair of actuators 706 disposed on each side of gate 704. The geometry and dimensions of gate 704 generally correspond to those of opening 708 of transport module 602, so that gate 704 can be used to provide a closure to isolate transport module 602. Optionally, gate 704 can provide a sealed closure to maintain a selected vacuum or pressurized environment within processing system 600 (FIGS. 6A and 6B) during wafer processing operations.

As shown in the embodiment of FIG. 7, gate 704 is an elongated plate coupled at each end to a pair of linear drive shafts 710 each stemming from actuators 706. It should be understood that the geometry of gate 704 may be changed to accommodate differently shaped or sized openings. Gate 704 may be sloped to form an inclined surface 712. The inclined surface provides gate valve assembly 702 a narrower profile, which allows process system 600 to maintain a small footprint (i.e. a minimal height). For example, inclined surface 712 may be sloped at any angle between about 5° and about 85° to the direction of actuation, which is adequately suited to allow for the proper performance of the present invention. In one embodiment, inclined surface 712 is angled at between about 30° and about 60° to the direction of actuation, more preferably about 45° to the direction of actuation.

Optionally, on a top and bottom portion of inclined surface 712 are contact portions, which extend along the elongated length of gate 704. An O-ring (not shown) may be provided on the contact portions to provide a seal, if desired. The contact portions of inclined surface 712, which may contact portions of transport module 602 at opening 708, may be coated with a soft buffer material to avoid metal-to-metal sliding contact, which helps to avoid the creation of contaminating particles.

Figure 8:
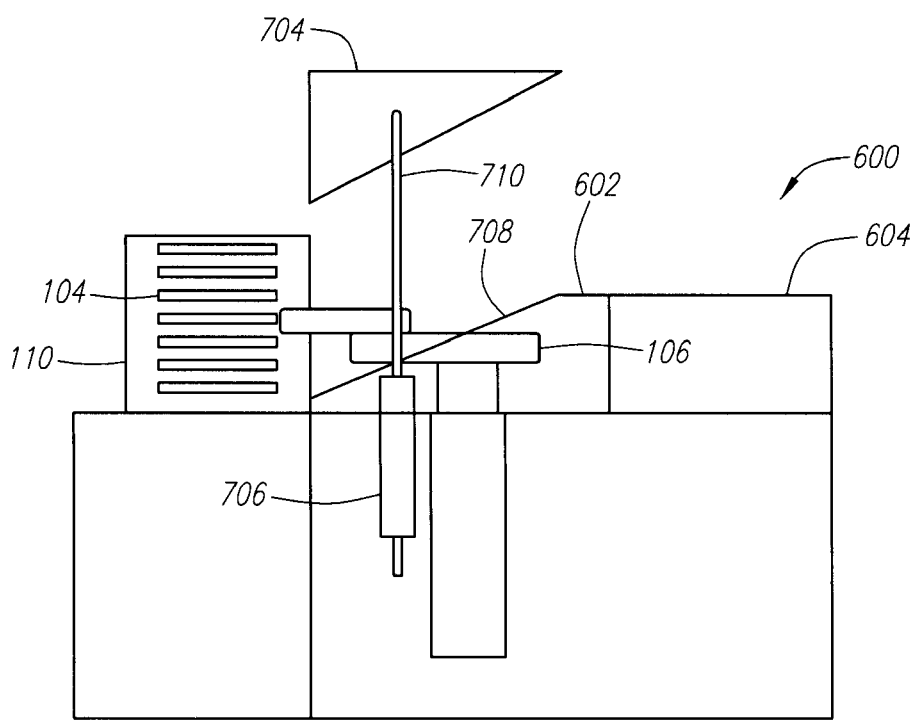
FIG. 8 is a simplified view of the processing system of FIGS. 6A and 6B in operation according to one embodiment of the present invention.

FIG. 8 is an illustration of the operation of transport module 602 of process system 600. By way of example, with no intent to limit the invention thereby, when drive shafts 710 are moved out of actuators 706, gate 704 is moved upward, away from opening 708 to provide a throughway for robot 106 with enough clearance that robot 106 can access wafers 104.

Drive shafts 710 are moved up and/or down by a linear action created using actuators 706. For example, in one embodiment, to move drive shafts 710, actuators 706 are supplied at a plumbing interface with a conventional fluid, such as compressed gas, water or alcohol. The supply of fluid causes drive shafts 710 to move linearly. To close gate 704, drive shafts 710 are moved down into actuators 706, thus providing isolation of transport module 602. The function and operation of actuators 706 are generally well known by those of ordinary skill in the art and are generally commercially available.

Advantageously, gate assembly 702 allows robot 106 to rise out of transport module 602, thus, allowing a full range of access to wafer load lock 110, while still maintaining a transport module of reduced dimension.

Having thus described embodiments of the present invention, persons skilled in the art will recognize that changes may be made in form and detail without departing from the scope of the invention. Thus the invention is limited only by the following claims.

What is claimed is:

1. A processing system comprising:
  a chamber defining an interior cavity;
  a processing tube assembly arranged within said interior cavity;
  a heating assembly moveable relative to said processing tube assembly from a first position where said processing tube assembly is disposed within said heating assembly and a second position where said processing tube assembly is exposed to an internal environment within said interior cavity of said chamber; and
  a linear motion mechanism disposed in said chamber for allowing said heating assembly to move relative to said processing tube assembly.

2. The processing system of claim 1, wherein said processing tube assembly is fixed to a wall of said chamber and wherein said heating assembly is coupled to said linear motion mechanism, wherein said heating assembly can be made to linear slide from said first position to said second position.

3. The processing system of claim 1, wherein said processing tube assembly comprises a process tube configured to receive a wafer for processing and wherein said heating assembly comprises a heating chamber including a plurality of heating elements, said heating chamber defining an internal space for receiving and substantially surrounding said process tube when in said first position and wherein said process tube is removed from said internal space when in said second position.

4. The processing system of claim 1, wherein said processing tube assembly comprises a process tube and wherein said heating assembly comprises a heating chamber including a plurality of heating elements, said heating chamber defining an internal space for receiving said process tube when in said first position and wherein said process tube and said heating elements are removed from within said heating chamber when in said second position.

5. The processing system of claim 1, wherein said processing tube assembly comprises a process tube including a gas inlet positioned on a front portion of said process tube for directing a process gas to a position within said process tube.

6. A processing system comprising:
  a chamber defining an interior cavity;
  a processing tube assembly arranged within said interior cavity; and
  a heating assembly moveable relative to said processing tube assembly from a first position where said processing tube assembly is disposed within said heating assembly and a second position where said processing tube assembly is exposed to an internal environment within said interior cavity of said chamber, said processing tube assembly including a process tube and said heating assembly including a heating chamber having a plurality of heating elements, said heating chamber defining an internal space for receiving said process tube when in said first position and wherein said process tube and said heating elements are removed from within said heating chamber when in said second position.

7. A processing system comprising:
  a chamber defining an interior cavity;
  a processing tube assembly arranged within said interior cavity; and
  a heating assembly moveable relative to said processing tube assembly from a first position where said processing tube assembly is disposed within said heating assembly and a second position where said processing tube assembly is exposed to an internal environment within said interior cavity of said chamber,
  said processing tube assembly including a process tube having a gas inlet positioned on a front portion of said process tube for directing a process gas to a position within said process tube.

8. A processing apparatus comprising:
  a processing tube;
  a heating chamber including a plurality of heating elements, said heating chamber defining an internal space for removably receiving said process tube, and
  an actuation mechanism to move said process tube into and out from said internal space,
  said processing tube, said heating chamber and said actuation mechanism are enclosed in a process chamber, said process tube is fixed to a wall of said process chamber and said heating chamber is coupled to said actuation mechanism, said actuation mechanism causing said heating chamber to move relative to said process tube exposing said process tube to an inner wall of said process chamber.

9. The apparatus of claim 8, wherein said processing tube comprises a gas inlet positioned on a front portion of said process tube for directing a process gas to a position within said process tube.

10. A processing apparatus comprising:
  a processing tube;
  a heating chamber including a plurality of heating elements, said heating chamber defining an internal space for removably receiving said process tube, and
  an actuation mechanism to move said process tube into and out from said internal space,
  said processing tube, said heating chamber and said actuation mechanism are enclosed in a process chamber, said process tube is fixed to a wall of said process chamber and said heating chamber is coupled to said actuation mechanism, said actuation mechanism causing said heating chamber to move relative to said process tube exposing said heating elements and said process tube to an inner wall of said process chamber.

11. An apparatus for conducting a process comprising:
  a processing module;
  a transport module including a transport mechanism coupled to said processing module; and a gate assembly including portions of walls of said transport module which can be moved from a closed position where said transport module is isolated from an external environment to an open position where said transport module is exposed to said external environment, said gate assembly in said open position providing clearance for said transport mechanism to rise in and out from within said transport module, a portion of said transport mechanism configured to rise above an external top surface of said transport module when said gate assembly is in said open position.

12. The apparatus of claim 11, wherein said transport module and said processing module combined comprise a volume of between about 20 liters to about 40 liters.

13. An apparatus for conducting a process comprising:

a processing module;

a transport module including a transport mechanism coupled to said processing module; and a gate assembly including portions of walls of said transport module which can be moved from a closed position where said transport module is isolated from an external environment to an open position where said transport module is exposed to said external environment, said gate assembly in said open position providing clearance for said transport mechanism to rise in and out from within said transport modules, said transport module and said processing module combined comprise a volume of between about 20 liters to about 40 liters.

* * * * *